US006228665B1

(12) United States Patent
Griffith et al.

(10) Patent No.: US 6,228,665 B1
(45) Date of Patent: May 8, 2001

(54) METHOD OF MEASURING OXIDE THICKNESS DURING SEMICONDUCTOR FABRICATION

(75) Inventors: Jonathan H. Griffith; Ronald L. Smith, both of Poughkeepsie; Roger L. Verkuil, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/597,637

(22) Filed: Jun. 20, 2000

(51) Int. Cl.$^7$ .................................................. G01R 31/26
(52) U.S. Cl. .......................... 438/14; 257/295; 257/296; 438/15; 438/240
(58) Field of Search .................................. 257/295, 296; 438/14, 15, 240; 435/6

(56) References Cited

U.S. PATENT DOCUMENTS

| | | |
|---|---|---|
| 4,004,843 | 1/1977 | Boenning et al. . |
| 4,461,690 * | 7/1984 | Rolff .................................. 204/228.1 |
| 4,993,957 | 2/1991 | Shino . |
| 5,023,561 | 6/1991 | Hillard . |
| 5,134,364 | 7/1992 | Karpman et al. . |
| 5,343,293 | 8/1994 | Berger et al. . |
| 5,366,670 * | 11/1994 | Giner ...................................... 205/83 |
| 5,485,091 | 1/1996 | Verkuil . |
| 5,500,607 | 3/1996 | Verkuil . |
| 5,605,615 * | 2/1997 | Goolsby ................................ 205/83 |
| 5,629,838 * | 5/1997 | Knight ................................... 361/782 |
| 5,638,103 * | 6/1997 | Obata .................................... 347/164 |
| 5,838,160 | 11/1998 | Beaman et al. . |
| 5,932,139 * | 8/1999 | Oshima .............................. 252/301.16 |
| 6,051,286 * | 4/2000 | Zhao ..................................... 427/576 |
| 6,149,780 * | 11/2000 | Miyake .............................. 204/228.1 |

* cited by examiner

Primary Examiner—John F. Niebling
Assistant Examiner—Andre C. Stevenson
(74) Attorney, Agent, or Firm—DeLio & Peterson, LLC; Robert Curcio; Ira D. Blecker

(57) ABSTRACT

A measurement of thickness of a metal oxide layer on a solder ball connection during semiconductor fabrication is demonstrated by an in-situ capacitance measurement of the oxide layer. A linear relationship is shown between the reactance of the metal oxide and its thickness. This linearity is derived empirically, and correlated to Auger Spectroscopy test results for accuracy. The linear relationship demonstrated with these measurements exhibits a linear correlation coefficient, $R^2$, greater than or equal to 0.974. This close, linear relationship allows for accurate testing of the oxide thickness using standard electrical parameter measurements during wafer fabrication.

The method requires the determination of an analytical relationship between dielectric thickness and dielectric capacitance; the performance of an in-situ test of the dielectric layer capacitance including measuring the dielectric layer capacitance; and, the calculation of the dielectric layer thickness by using reactance values, calculated from the measured dielectric layer capacitance, as a variable within the analytical relationship.

18 Claims, 5 Drawing Sheets

METHOD OF MEASURING OXIDE THICKNESS DURING SEMICONDUCTOR FABRICATION

BACKGROUND OF THE INVENTION

1. Field of the Invention

The present invention relates generally to techniques for measuring thin insulating layers on a semiconductor wafer, and more particularly, to measurements of very thin metal oxide layers accumulated on C4 solder connections.

2. Description of Related Art

Solder connections composed of PbSn material are generally used for electrical and mechanical attachment for integrated circuit fabrication. Undesired residual metal oxides on the surface of C4 solder connections or balls can prevent an integrated circuit chip from successfully joining or wetting to a chip carrier. A thin layer of metal oxide on the surface of these solder joints will detrimentally contribute to failed electrical connections, and may compromise the chip's mechanical integrity. The metal oxides are non-conductive, having depositions that are difficult to minimize or eliminate. Oxide build-up on solder joints, such as the C4 balls, poses unique problems to the integrated circuit chip manufacturer. The ability to monitor and measure expeditiously the oxide accumulation on a substrate, particularly on the solder joints or balls of the substrate surface, within a real-time, non-destructive measurement, would greatly enhance chip yield, and decrease or eliminate infantile failures commonly associated with the fabrication process. Monitoring oxide thickness of these electrical connections would help minimize the solder joints that remain non-wettable, and facilitate inspecting the health of the manufacturing line.

Oxide thickness has been monitored previously within the art; however, the measurement techniques implemented have been limited in speed and simplicity, and at times have been shown to be destructive to the device under test.

In U.S. Pat. No. 5,485,091, issued to Verkuil on Jan. 16, 1996, entitled "CONTACTLESS ELECTRICAL THIN OXIDE MEASUREMENTS," a method using corona discharge was taught for measuring the thickness of very thin oxide layers on a silicon substrate. This method involved the active deposition of charge using a corona discharge gun, and then correlated the change in surface potential to layer thickness.

Other passive measurements have also been introduced, using optical or electrical instrumentation. For example, in U.S. Pat. No. 5,343,293 issued to Berger et al., on Aug. 30, 1994, entitled "ELLIPSOMETER," an optical ellipsometer is used to measure the thickness of oxide films on silicon wafers based on a discernible change in polarized light passing through the film.

Other oxide thickness measurements have relied upon the break down voltage of the oxide dielectric to ascertain the approximate thickness of the film deposition. This, however, is considered a destructive test since the punch-through voltage is capable of delivering additional electrical stress to the product.

Additionally, these methods are not well suited for in-situ monitoring during wafer fabrication. The equipment necessary for implementation is costly and burdensome to operate, typically requiring specially trained technicians. A less time-consuming measurement which can accurately account for extremely thin oxide films, on the order of forty (40) to one hundred sixty angstroms (160), without requiring extensive deviation to the fabrication process, remains an unresolved need in the art.

Bearing in mind the problems and deficiencies of the prior art, it is therefore an object of the present invention to provide a method for measuring oxide thickness during semiconductor fabrication utilizing general electrical parameter measurements that can be easily tested within the fabrication process.

It is another object of the present invention to provide a non-destructive oxide thickness measurement to be used in-situ during semiconductor wafer fabrication.

A further object of the invention is to provide a technique for measuring oxide layer thickness in the regime of forty to one hundred sixty angstroms on solder connections during wafer fabrication.

It is yet another object of the present invention to provide a real-time, non-destructive measurement of oxide layer thickness on a C4 solder connection of a semiconductor substrate.

Still other advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for measuring a dielectric layer having capacitance and a thickness, on a conductive material, comprising: providing the dielectric layer; determining an analytical relationship between the dielectric layer thickness and the dielectric layer capacitance; performing an in-situ test of the dielectric layer including measuring the dielectric layer capacitance; and, calculating the dielectric layer thickness by using the measured dielectric layer capacitance. This analytical relationship may be a linear relationship, empirically obtained.

The step of performing the in-situ test may further comprise: placing a test probe on the dielectric layer, the test probe comprising a conductive elastomer portion, a conductive push rod portion, and an insulator portion; connecting an AC generator having an output and a ground return, the AC generator output connecting to the conductive push rod portion, the ground return connecting to the conductive material; measuring a voltage drop across the elastomer portion and the conductive material; and, determining the dielectric layer capacitance from the voltage drop measurement. Predetermining the analytical relationship comprises: performing a plurality of dielectric layer capacitance measurements; converting the plurality of capacitance measurements into reactance values; and, forming the analytical relationship between the reactance values and the dielectric layer thickness, using reactance as a variable in the analytical relationship.

In a second aspect, the instant invention is directed to a method of measuring a thickness of a dielectric layer during semiconductor wafer processing, the dielectric layer formed on a conductive surface, and having capacitance and reactance, the method comprising: providing the dielectric layer; measuring the capacitance of the dielectric layer; calculating the reactance from the capacitance measurement; and, determining the dielectric thickness by using the reactance as a variable within an analytical expression relating reactance to the dielectric thickness.

The step of measuring the capacitance further comprises: measuring a voltage drop across the dielectric layer; and, calculating the dielectric capacitance from the voltage drop measurement.

The voltage drop measurement further comprises: placing a test probe on the dielectric layer, the test probe including a conductive elastomer portion, a conductive push rod portion, and an insulator portion; connecting an AC generator having an output and a ground return, the AC generator output connecting to the conductive push rod, the ground return connecting to the conductive material.

Determining the dielectric layer thickness includes: determining the analytical expression by first measuring a plurality of reactance values from a plurality of dielectric layers using material of the same type as the dielectric layer; measuring thickness of the plurality of dielectric layers using a second thickness measurement scheme; and, developing a best curve fit of the plurality of reactance values to the measured thickness of the plurality of dielectric layer thickness, using reactance as a variable.

In a third aspect, the instant invention is directed to a method of measuring a dielectric layer thickness on a solder connection, in-situ during semiconductor wafer fabrication, the dielectric layer having a capacitance and a reactance, comprising: providing the dielectric layer on the solder connection; measuring the capacitance of the dielectric layer; converting the capacitance to a reactance; and, determining the dielectric layer thickness analytically, using the reactance as a variable.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
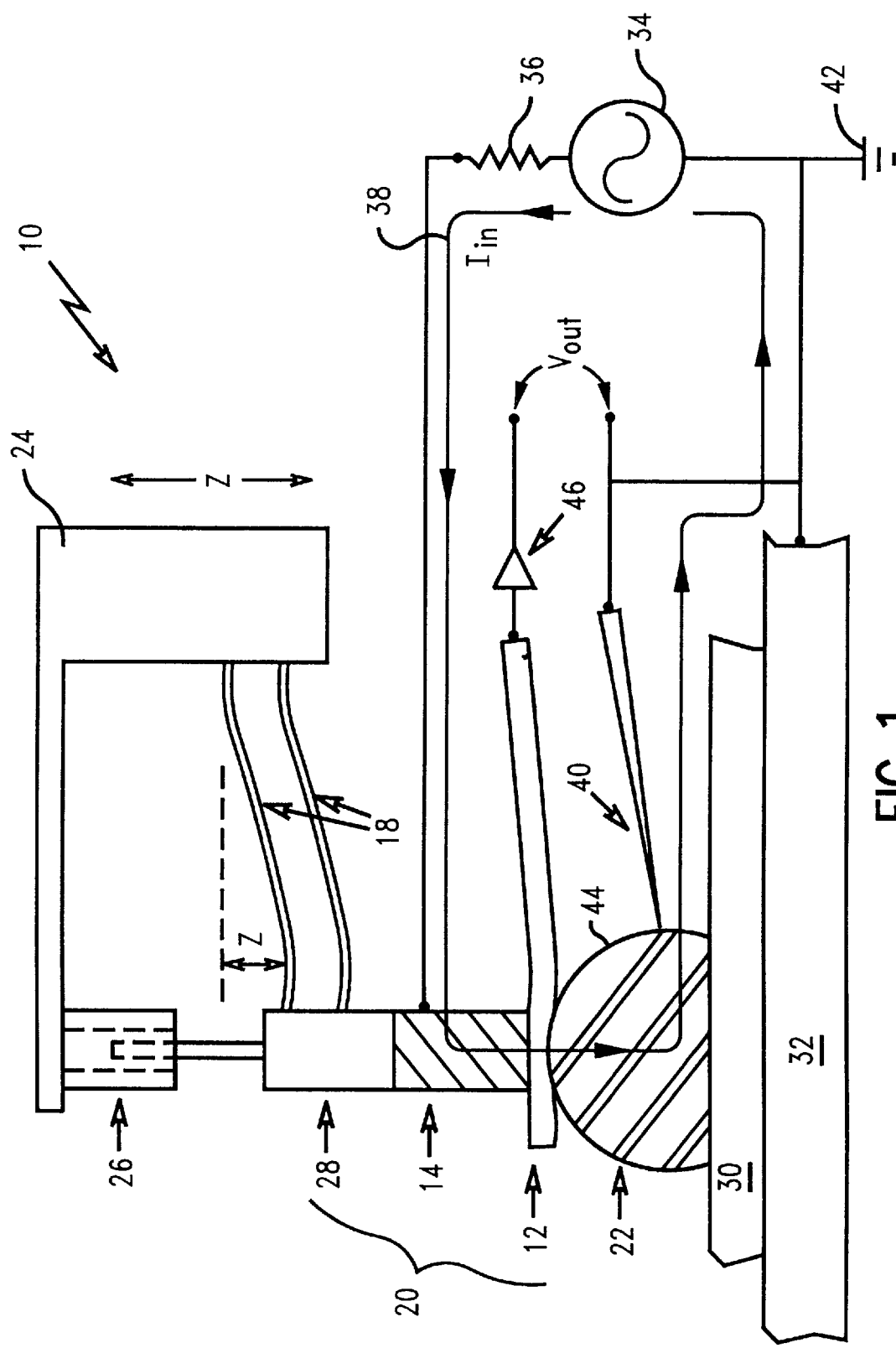
FIG. 1 depicts a generalized capacitance test set-up using an elastomeric test probe.

In describing the preferred embodiment of the present invention, reference will be made herein to FIGS. 1–5 of the drawings in which like numerals refer to like features of the invention. Features of the invention are not necessarily shown to scale in the drawings.

Simplicity and test speed provide unique advantages over the existing prior art for measuring oxide layer thickness in-situ during wafer fabrication. A method of utilizing the measurement of common electrical parameters, and correlating these measurements to known deviations in oxide thickness, provides a low-cost, expeditious approach for monitoring oxide films.

Residual oxide films build-up on solder joints during fabrication with the detrimental effect of prohibiting wetting or solderability, and insulating the electrically conductive solder joint. It is necessary for manufacturers to measure this oxide build-up accurately, and in real-time, during semiconductor wafer processing. Measuring both the capacitive and reactive components of the oxide film using a closed-loop measurement technique can provide for the proper assessment of oxide film thickness when certain thickness-capacitance relationships are formulated.

General Test Set-up

Preferably, a probe covered with a soft membrane-like conductive elastomer material is employed to measure the oxide capacitance. This probe can be one similar to that taught by Karpman, et al., in U.S. Pat. No. 5,134,364, entitled "ELASTOMERIC TEST PROBE."

FIG. 1 depicts the generalized electrical metal oxide capacitance measurement test set-up 10 using an elastomeric test probe. The test probe 20 consists of a tip having conductive elastomeric material 12 attached to a conductive push rod 14 and insulating portion 28. The conductive elastomer is shown, by way of example, as a sheet extending beyond the dimensions of the conductive push rod 14. However, the elastomeric material is typically within the dimensions of conductive push rod for optimum operability. This conductive tandem is used to make contact with the object under test, which is shown to be a C4 solder ball 22. The conductive push rod 14 is controlled in the vertical or z-direction by a controller 24 operating on a displacement transducer 26. Displacement z is indicated by the movement of the probe about an initial position. The transducer connects to the insulating portion 28 of the test probe 20. Metal bands 18 work with transducer 26 to control the amount of force required for the appropriate z-control movement for the probe. The C4 solder ball 22 resides on a wafer or semiconductor product 30 under test, secured to the test station by vacuum chuck 32. The closed-loop electrical circuit used for capacitance measurements requires an AC voltage generator 34 having internal impedance 36, capable of delivering input current 38 through the conductive push rod 14, the conductive elastomer 12, and C4 solder ball 22. A ground needle 40 provides the return path to ground 42 for the input current 38.

Conceptually, a parallel plate capacitor is formed by the surface 44 of the PbSn C4 solder ball 22 which acts as one plate, the oxide film (between the solder ball surface 44 and the elastomer 12) which acts as the dielectric, and the elastomer 12 which acts as the second plate. By measuring the voltage drop, $V_{out}$, from the elastomer 12 to ground 42, using typical electronic components to enhance the signal integrity, such as buffer 46, the capacitance of the oxide film can be empirically resolved. The AC voltage induced within this circuit by generator 34 is applied at a non-destructive level, below the break-down voltage potential of the oxide film. The degree of electrical blocking through the closed-loop circuit tends to monotonically increase with increasing thickness of oxide, thus providing an indicator for oxide thickness of the residual metal on the surface of the C4 solder ball.

Figure 2:
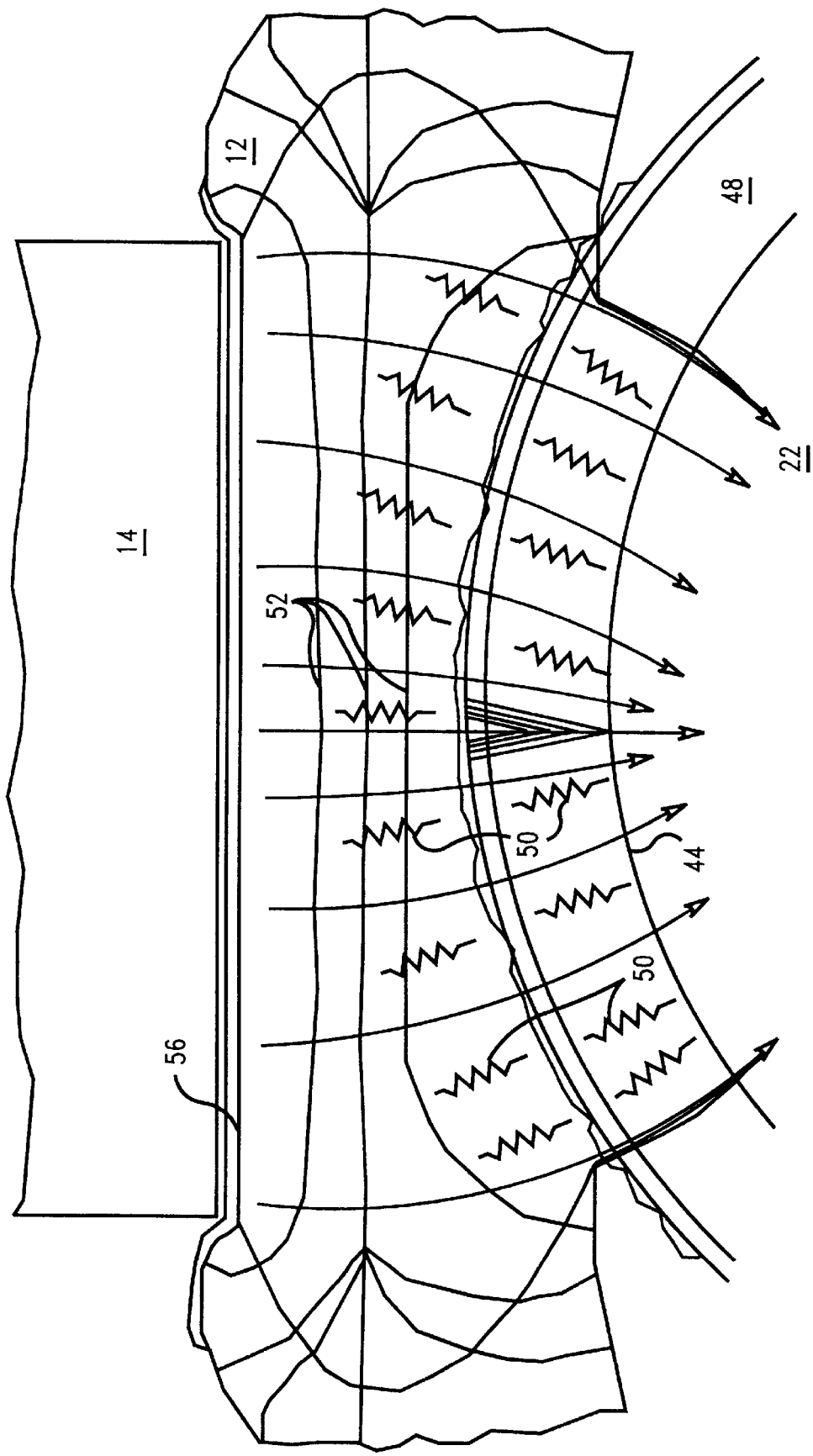
FIG. 2 depicts an expanded cross-sectional view of the capacitor created by the elastomer probe-oxide-solder ball combination.

FIG. 2 depicts an expanded cross-sectional view of the capacitor created by the elastomer probe-oxide-solder ball combination. For clarity, these elements are not shown to scale. The elastomer 12 and the oxide 48 will both have some form of reactance 50 due to the nature of their composition. Field lines 52 indicate the parallel, uniform nature of the electric field over the measurement area of concern, between the flat push rod end 56 and the slightly curved solder ball surface 44.

Method of Measuring Oxide Thickness

In order to ascertain the oxide thickness from this in-situ capacitance measurement, an initial correlation of oxide thickness versus capacitance must first be determined. Known samples of C4 solder balls having oxide layers of varying thickness are measured using existing state-of-the-art equipment which, although extremely accurate, may not be suitable for production line testing. For example, Auger Spectroscopy techniques provide precise residual oxide thickness measurements of oxide layers on C4 solder balls. This technique is a sophisticated, destructive, expensive, and time-consuming process, which could not be done on a real-time basis during the production build. Table I represents some initial measurements taken by Auger Spectroscopy of residual metal oxide samples for six different wafers, and a comparison to the same wafers measured by the emox capacitance method of the instant invention.

TABLE I

| Wafer ID | Auger Spectroscopy (Angstroms) | Electrical Metal Oxide Capacitance Test Method (Angstroms) |
| --- | --- | --- |
| 3VP | 57 | 62 |
| 0910 | 160 | 167.2 |
| UZFHKG | 89.8 | 93.2 |
| XU04Z5A | 53.2 | 64 |
| ML5C1FG | 99.8 | 93.6 |
| XX0EJBA | 76 | 87 |

Figure 3:
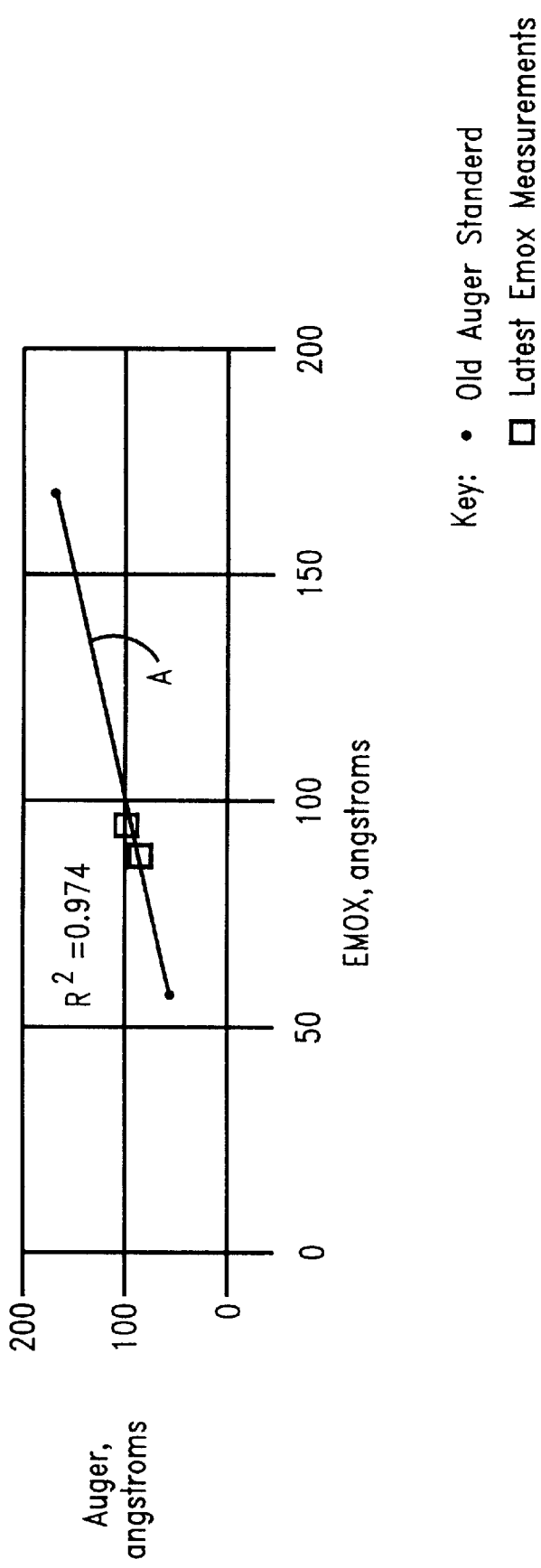
FIG. 3 is a graph of the linear relationship between the electrical metal oxide (emox) measurements of the instant invention and measurements performed by Auger Spectroscopy.

Using the electrical metal oxide (emox) capacitance test method of the instant invention, i.e., measuring the capacitance of the oxide layer(s) and ultimately converting this value to oxide thickness, a linear relationship is shown with the standard engineering test method using Auger Spectroscopy. Referring to FIG. 3, line A represents this linear relationship between the two measurements, with these measurements exhibiting a linear correlation coefficient, $R^2$, equal to 0.974. This close, linear relationship allows for accurate testing of the oxide thickness using standard electrical parameter measurements during wafer fabrication.

The relationship between oxide thickness and reactance, $X_{cp}$ or $1/j\omega C$, is also linear, and can be expressed by the equation:

$$T_{ox} = 1.26 X_{cp} - 119.4$$

where,
$T_{ox}$ = oxide thickness (angstroms)
$X_{cp}$ = capacitive reactance (kilo-ohms)

The slope (1.26) and y-intercept (119.4) of this expression are empirically derived values that can be adjusted to accommodate measurement system variations. By comparing the capacitance of the measured oxide layers, C, and its corresponding reactance to oxide layer thickness, $1/j\omega C$, the above linear correlation is demonstrated. Specifically, this correlation is extremely accurate within the regime of oxide thickness less than one hundred sixty angstroms.

Table II depicts five measurements for three different monitor wafers. This data indicates the linear relationship between reactance and oxide thickness ($T_{emox}$) measured by this electrical metal oxide (emox) or capacitance method, and compares the computed thickness to measurements made by Auger Spectroscopy. Using this data, the slope and intercept were calculated for the above-identified linear expression, and the linearity between the two test methodologies confirmed.

Figure 4:
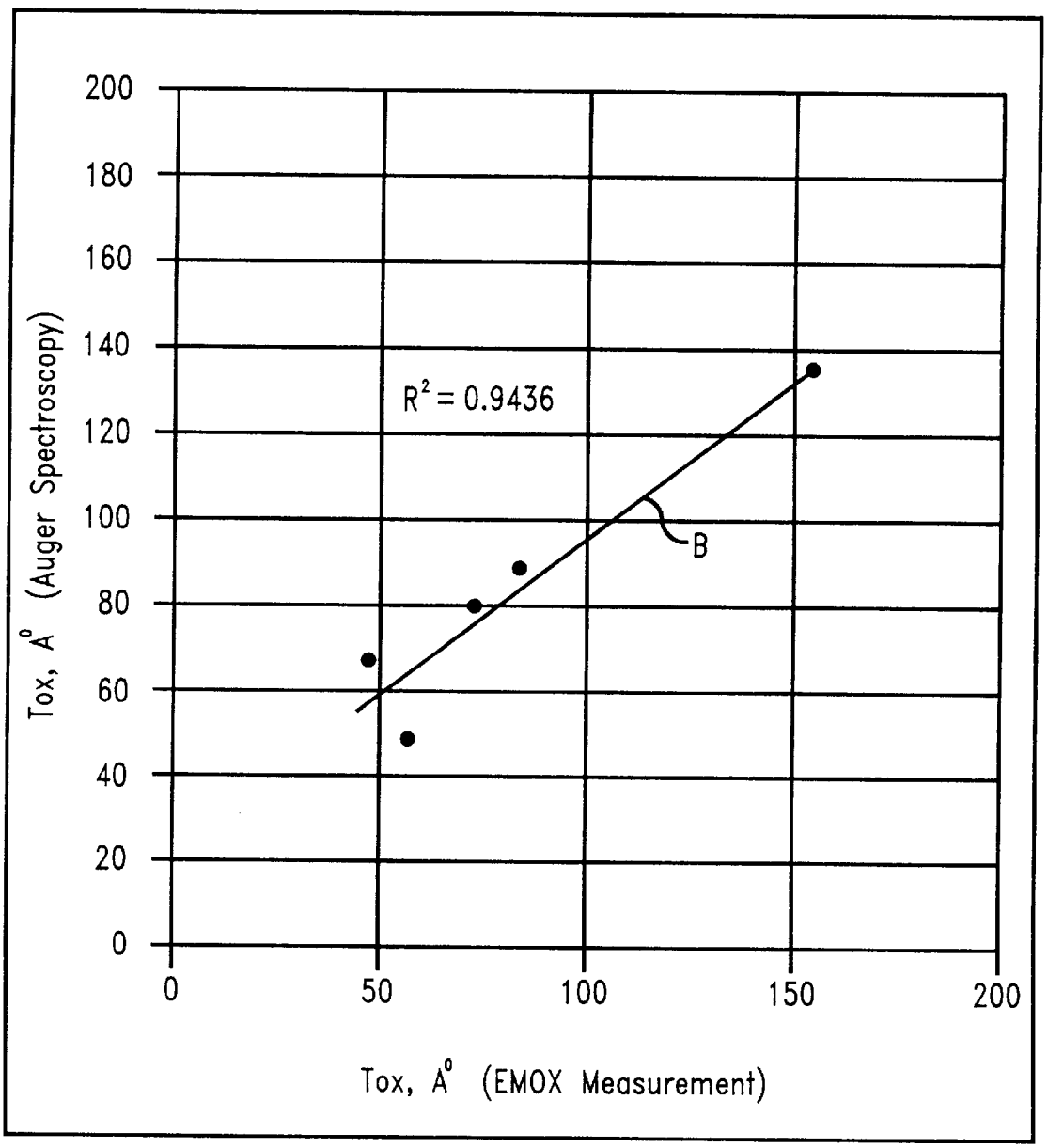
FIG. 4 is a second graph of the linear relationship between the electrical metal oxide (emox) measurements of the instant invention and measurements performed by Auger Spectroscopy.
Figure 5:
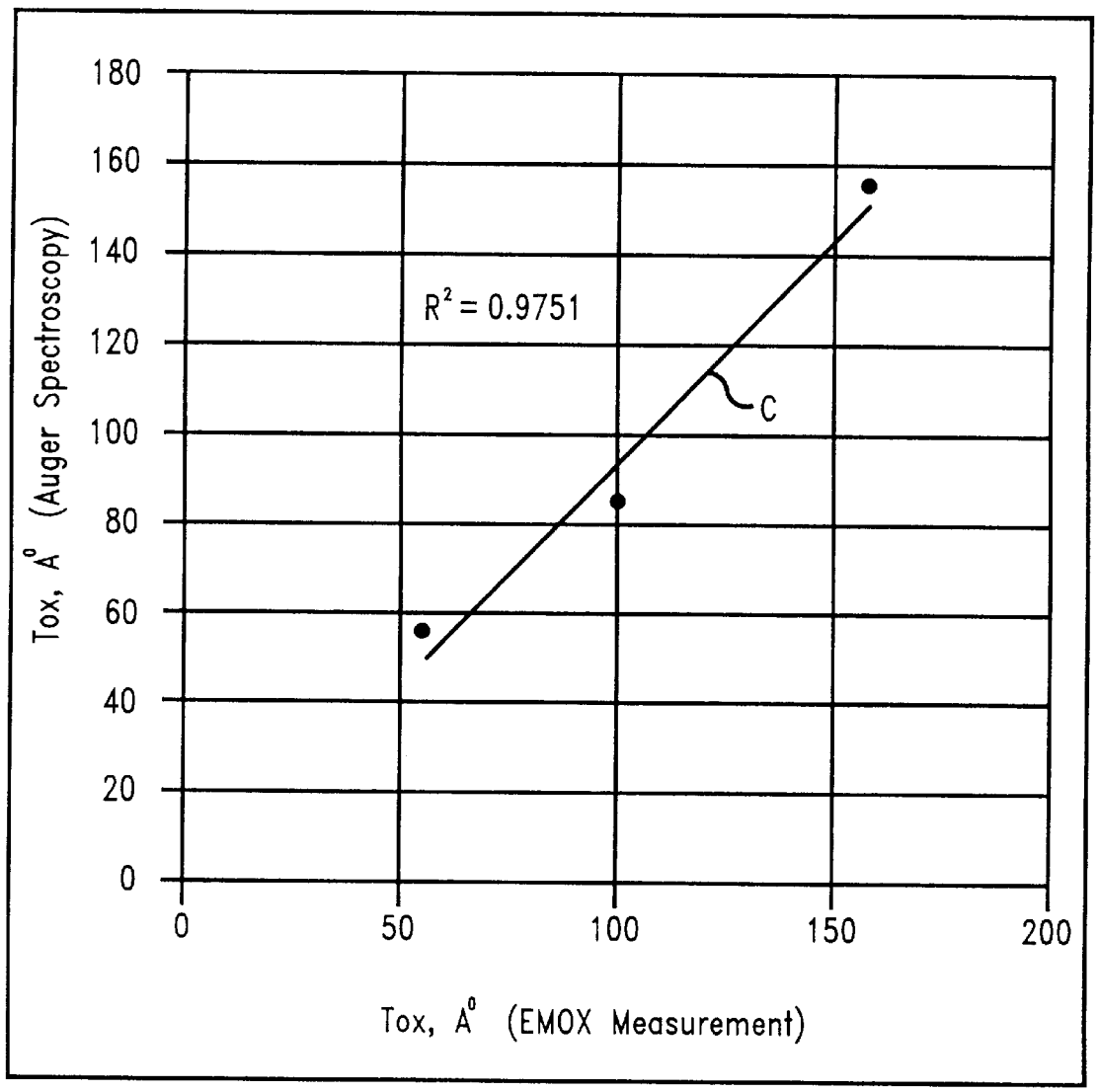
FIG. 5 is a third graph of the linear relationship between the electrical metal oxide (emox) measurements of the instant invention and measurements performed by Auger Spectroscopy.

The impedance (reactance) values obtained yield oxide thickness values that are within the error margin for oxide thickness measurements by Auger Spectroscopy. In a similar fashion to FIG. 3, FIGS. 4 and 5 compare the thickness measurements made by these different methodologies and show a close linear relationship ($R^2 > 0.94$) between them. In FIG. 4, line B represents the linearity between the electrical metal oxide measurement and the Auger Spectroscopy measurement. This line has a linear correlation coefficient of $R^2 = 0.9436$. In FIG. 5, a similar calculation, as depicted by line C, yields a correlation coefficient of $R^2 = 0.9751$.

TABLE II

|  | 1 | 2 | 3 | 4 | 5 |
| --- | --- | --- | --- | --- | --- |
| mag | 6.14 | 6.09 | 6.02 | 6.04 | 8.26 |
| phase | 76.4 | 82.0 | 82.0 | 82.6 | 44.6 |
| Xcp | 145.1 | 143.5 | 145.4 | 144.6 | 149.8 |
| $T_{emox}$ | 63 | 61 | 64 | 63 | 69 |

Device: WK08PbSn; WID: ZU04Z5A
Auger measurement: 53.2 Angstroms
$X_{cp}$ (ave): 145.6
$T_{emox}$ (ave): 64 Angstroms

| mag | 6.52 | 7.88 | 5.48 | 4.37 | 6.73 |
| --- | --- | --- | --- | --- | --- |
| phase | 53.7 | 42.9 | 70.9 | 32.7 | 51.1 |
| Xcp | 167.5 | 163.7 | 170.3 | 174.8 | 168.2 |
| $T_{emox}$ | 92 | 87 | 95 | 101 | 93 |

Device: WK08PbSn; WID: ML5C1FG
Auger measurement: 168.9 Angstroms
$X_{cp}$ (ave): 168.9
$T_{emox}$ (ave): 93.4 Angstroms

| mag | 8.13 | 7.84 | 5.59 | 5.72 | 5.38 |
| --- | --- | --- | --- | --- | --- |
| phase | 39.6 | 43.7 | 83.3 | 71.6 | 77.5 |
| $X_{cp}$ | 170.0 | 161.8 | 157.4 | 166.4 | 167.5 |
| $T_{emox}$ | 95 | 85 | 79 | 84 | 92 |

Device: WK09PbS2; WID: XX0EJBA
Auger measurement: 76 Angstroms
$X_{cp}$ (ave): 163.6
$T_{emox}$ (ave): 87 Angstroms
Best Fit Line: $T_{emox} = 1.26 * X_{cp} - 119.4$ This linearity supports the accuracy of oxide thickness data from a known value of an emox measurement—represented in the figures as the abscissa. Thus, emox measurements of capacitance, which are then converted into reactance values, can be used to accurately calculate oxide thickness from the empirically derived linear equation.

By developing an analytical formula to correlate capacitance (reactance) to oxide thickness, further capacitance measurements may be made, and oxide thickness predicted, based on this empirically derived relationship. Establishing this linear relationship, makes it feasible to perform accurate oxide thickness measurements in-situ, on an efficient, cost effective basis.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for measuring a dielectric layer having capacitance and a thickness, on a conductive material, comprising:

providing said dielectric layer;

determining an analytical relationship between said dielectric layer thickness and said dielectric layer capacitance;

performing an in-situ test of said dielectric layer including measuring said dielectric layer capacitance; and, calculating said dielectric layer thickness by using the measured dielectric layer capacitance.

2. The method of claim 1 wherein said analytical relationship is a linear relationship empirically obtained.

3. The method of claim 1 wherein said conductive material is a solder ball having a top surface and said dielectric layer is a metal oxide on said top surface.

4. The method of claim 1 wherein said method is employed in-situ during semiconductor wafer processing.

5. The method of claim 1 wherein said step of performing said in-situ test further comprises:

placing a test probe on said dielectric layer, said test probe comprising a conductive elastomer portion, a conductive push rod portion, and an insulator portion;

connecting an AC generator having an output and a ground return, said AC generator output connecting to said conductive push rod portion, said ground return connecting to said conductive material;

measuring a voltage drop across said elastomer portion and said conductive material; and, determining said dielectric layer capacitance from said voltage drop measurement.

6. The method of claim 1 wherein predetermining said analytical relationship comprises:

performing a plurality of dielectric layer capacitance measurements;

converting said plurality of capacitance measurements into reactance values; and, forming said analytical relationship between said reactance values and said dielectric layer thickness, using reactance as a variable in said analytical relationship.

7. A method of measuring a thickness of a dielectric layer during semiconductor wafer processing, said dielectric layer formed on a conductive surface, and having capacitance and reactance, said method comprising:

providing said dielectric layer;

measuring said capacitance of said dielectric layer;

calculating said reactance from said capacitance measurement; and, determining said dielectric thickness by using said reactance as a variable within an analytical expression relating reactance to said dielectric thickness.

8. The method of claim 7 wherein said step of measuring said capacitance further comprises:

measuring a voltage drop across said dielectric layer, and, calculating said dielectric capacitance from said voltage drop measurement.

9. The method of claim 8 wherein the voltage drop measurement further comprises:

placing a test probe on said dielectric layer, said test probe including a conductive elastomer portion, a conductive push rod portion, and an insulator portion; and, connecting an AC generator having an output and a ground return, said AC generator output connecting to said conductive push rod, said ground return connecting to said conductive material.

10. The method of claim 7 wherein said conductive surface comprises a solder ball and said dielectric layer comprises a metal oxide on said solder ball.

11. The method of claim 7 wherein determining said dielectric layer thickness includes:

determining said analytical expression by first measuring a plurality of reactance values from a plurality of dielectric layers using material of the same type as said dielectric layer;

measuring thickness of said plurality of dielectric layers using a second thickness measurement scheme; and, developing a best curve fit of said plurality of reactance values to said measured thickness of said plurality of dielectric layer thickness, using reactance as a variable.

12. The method of claim 11 wherein said second thickness measurement scheme comprises employing Auger Spectroscopy.

13. The method of claim 7 wherein said analytical expression comprises a linear relationship between said plurality of reactance values and said measured thickness of said plurality of dielectric layer thickness, wherein said reactance represents the slope of said linear relationship.

14. The method of claim 13 further comprising determining said linear relationship from predetermined empirically derived measurements.

15. The method of claim 7 wherein measuring said thickness of said dielectric layer in performed in-situ.

16. A method of measuring a dielectric layer thickness on a solder connection, in-situ during semiconductor wafer fabrication, said dielectric layer having a capacitance and a reactance, comprising:

providing said dielectric layer on said solder connection;

measuring said capacitance of said dielectric layer;

converting said capacitance to a reactance;

determining said dielectric layer thickness analytically, using said reactance as a variable.

17. The method of claim 16 wherein measuring said capacitance further comprises:

placing a test probe on said dielectric layer, said test probe including a conductive elastomer portion, a conductive push rod portion, and an insulator portion;

connecting an AC generator having an output and a ground return, said AC generator output connecting to said conductive push rod portion, said ground return connecting to said conductive material;

measuring a voltage drop across said dielectric layer; and, determining said capacitance of said dielectric layer from said voltage drop measurement.

18. The method of claim 16 wherein determining said dielectric layer thickness analytically further includes:

measuring a plurality of capacitance values for a plurality of dielectric layers;

converting said plurality of said capacitance values to reactance values; and, determining a relationship between said reactance values and said dielectric thickness.

\* \* \* \* \*